United States Patent
White

(10) Patent No.: US 10,488,908 B2
(45) Date of Patent: *Nov. 26, 2019

(54) METHOD OF COMMUNICATING BETWEEN PHASES OF AN AC POWER SYSTEM

(71) Applicant: Silergy Corp.

(72) Inventor: Bertram John White, Irvine, CA (US)

(73) Assignee: Silergy Corp., Cayman Islands (GB)

( * ) Notice: Subject to any disclaimer, the term of this patent is extended or adjusted under 35 U.S.C. 154(b) by 40 days.

This patent is subject to a terminal disclaimer.

(21) Appl. No.: 15/876,349

(22) Filed: Jan. 22, 2018

(65) Prior Publication Data

US 2018/0157302 A1 Jun. 7, 2018

Related U.S. Application Data

(63) Continuation of application No. 15/005,814, filed on Jan. 25, 2016, now Pat. No. 9,921,634.

(60) Provisional application No. 62/181,035, filed on Jun. 17, 2015.

(51) Int. Cl.
| | |
|---|---|
| G06F 1/3206 | (2019.01) |
| G01R 19/25 | (2006.01) |
| G01R 21/06 | (2006.01) |
| G01R 21/133 | (2006.01) |
| G08C 19/02 | (2006.01) |
| H04L 25/02 | (2006.01) |
| G06F 1/30 | (2006.01) |
| H04Q 9/00 | (2006.01) |

(52) U.S. Cl.
CPC ....... *G06F 1/3206* (2013.01); *G01R 19/2513* (2013.01); *G01R 21/06* (2013.01); *G01R 21/133* (2013.01); *G06F 1/30* (2013.01); *G08C 19/02* (2013.01); *H04L 25/0266* (2013.01); *H04L 25/0274* (2013.01); *H04Q 9/00* (2013.01)

(58) Field of Classification Search
None
See application file for complete search history.

(56) References Cited

U.S. PATENT DOCUMENTS

| | | | | |
|---|---|---|---|---|
| 5,498,956 A | * | 3/1996 | Kinney | G01R 21/133 324/142 |
| 5,790,391 A | * | 8/1998 | Stich | H02J 9/062 307/64 |
| 2002/0172351 A1 | * | 11/2002 | Beutler | H04L 25/0266 379/399.01 |
| 2004/0172207 A1 | * | 9/2004 | Hancock | G01R 19/2513 702/60 |

* cited by examiner

*Primary Examiner* — Douglas X Rodriguez

(57) ABSTRACT

A differential coupling path is provided for power measurement communication between a host device and a line side device. The line side device couples to AC power grid to extract voltage signals and current signals using various voltage and current sensors. The extracted voltage signal and current signal are converted to digital signals by internal A/D converters within the line device and then sent to the host device through the differential coupling path coupled between the host device and the line side device. The host device may couple to one or more line side devices via multiple differential coupling paths.

29 Claims, 5 Drawing Sheets

METHOD OF COMMUNICATING BETWEEN PHASES OF AN AC POWER SYSTEM

CROSS-REFERENCE TO RELATED APPLICATIONS

This application is a continuation of the following application, U.S. patent application Ser. No. 15/005,814, filed on Jan. 25, 2016, and which is hereby incorporated by reference as if it is set forth in full in this specification, and which also claims the benefit of U.S. Provisional Patent Application No. 62/181,035, titled "Method of Communicating between Phases of an AC Power System," filed Jun. 17, 2015, which application is hereby incorporated herein by reference in its entirety.

BACKGROUND

A. Technical Field

The present invention relates generally to the field of electrical power measurement.

B. Background of the Invention

Electricity is generally measured in terms of an amount of total energy consumed over a given time. Electricity meters generally measure total power consumed by measuring the voltage and the current at a given instant in time and integrating the product of the measured voltage and current over desired time period.

Typically, a power measurement system comprises a line side device coupled to the AC power line to extract measurement signals, a host side device and a coupling device coupled between the line side device and the host side device. The coupling device is used to isolate the host side device from the relative high voltage AC power line for protection purpose.

U.S. Pat. No. 8,144,446 discloses the usage of a pulse transformer as barrier isolation to electrically isolate the host side device from the line side device. However, pulse transformer is expensive and susceptible to magnetic tamper. Pulse transformer with tamper resistance will further increase the cost. It is challenging to pass EMI test for pulse structure because of its low impedance nature and associated drive circuits.

Optical isolator, also called opto-isolator, may be used as a barrier isolator for power measurement system. Optical isolators are relatively expensive and affordable optical isolators typically have low operation speed (<10 kb/s) and thus limited system performance.

Therefore, it would be desirable to implement improved coupling method and interface with good combination of affordability and performance.

SUMMARY OF THE INVENTION

Embodiments of the invention relate to electrical power measurement and method of communicating between phases of an AC power measurement system.

In various embodiments, a differential coupling path is provided for power measurement communication between a host device and a line side device. The line side device couples to the AC power grid to extract measurement signals including voltage signals and current signals, using various sensors such as a voltage divider, a shunt resistor, and/or a Rogowski coil, etc. The extracted voltage signal and current signal are converted to digital signals by internal A/D converters within the line device and then sent to the host device through the differential coupling path coupled between the host device and the line side device. The host device may couple to one or more line side devices via multiple differential coupling paths, with each differential coupling path being the same or different.

In these certain embodiments, the differential coupling path is a differential resistor-capacitor (RC) coupling path comprising two coupling links. Each link comprises a resistor and a capacitor in serial connection. Preferably, the resistor and capacitor values of the two links are identical for desired signal attenuation. Practically, even when the resistor and capacitor values of the two links are mismatched by a small percentage due to engineering tolerance, the common mode signal attenuation is still within an acceptable range.

In certain operation conditions, the line side device comprises at least two A/D converters, a transceiver and an I/O logic module coupled between the A/D converters and the transceiver. The I/O module receives inputs from the A/D converters and sends an output to the transceiver. Moreover, the I/O module may also receive input from the transceiver. The transceiver couples to host device via the differential path and may transfer data bi-directionally to the host device.

In certain operation conditions, the transceiver comprises an output resistor pair coupling to each link of the differential RC coupling path. The output resistor is smaller in resistance value than the resistor in the resistor-capacitor link for desired signal attenuation ratio. In some embodiments, the output resistor pair is coupled to the differential RC coupling path only when the transceiver is working in a receiver mode to receive signals.

In certain operation conditions, the host device comprises a host transceiver to communicate with one or more line side devices. The host transceiver may receive signals from the line side devices or send commands to the line side devices for specific or additional data request. In some embodiments, the host transceiver also comprises a host output resistor pair coupling to each link of the differential resistor-capacitor (RC) path.

BRIEF DESCRIPTION OF THE DRAWINGS

Reference will be made to exemplary embodiments of the present invention that are illustrated in the accompanying figures. Those figures are intended to be illustrative, rather than limiting. Although the present invention is generally described in the context of those embodiments, it is not intended by so doing to limit the scope of the present invention to the particular features of the embodiments depicted and described.

FIG. 4 *b*) is an exemplary schematic diagram of a host device with differential path mismatch compensation circuit according to various embodiments of the invention.

One skilled in the art will recognize that various implementations and embodiments of the invention may be practiced in accordance with the specification. All of these implementations and embodiments are intended to be included within the scope of the invention.

DETAILED DESCRIPTION OF THE PREFERRED EMBODIMENTS

In the following description, for the purpose of explanation, specific details are set forth in order to provide an understanding of the present invention. The present invention may, however, be practiced without some or all of these details. The embodiments of the present invention described below may be incorporated into a number of different electrical components, circuits, devices, and systems. Structures and devices shown in block diagram are illustrative of exemplary embodiments of the present invention and are not to be used as a pretext by which to obscure broad teachings of the present invention. Connections between components within the figures are not intended to be limited to direct connections. Rather, connections between components may be modified, re-formatted, or otherwise changed by intermediary components.

When the specification makes reference to "one embodiment" or to "an embodiment", it is intended to mean that a particular feature, structure, characteristic, or function described in connection with the embodiment being discussed is included in at least one contemplated embodiment of the present invention. Thus, the appearance of the phrase, "in one embodiment," in different places in the specification does not constitute a plurality of references to a single embodiment of the present invention.

Various embodiments of the invention are used for communication between a host device and a line side device via a differential coupling path. The line side device couples to AC power line to exact measurement signals including voltage signals and current signals, using various sensors such as a voltage divider, a shunt resistor, and/or a Rogowski coil, etc. The extracted voltage signal and current signal are converted to digital signals by internal A/D converters within the line device and then sent to the host device through the differential coupling path coupled between the host device and the line side device. The host device may couple to one or more line side devices via multiple differential coupling paths, with each differential coupling path being the same or different. Furthermore, a transceiver is incorporated within the line side device and the host device as an interface to communicate to the differential coupling path.

Figure 1:
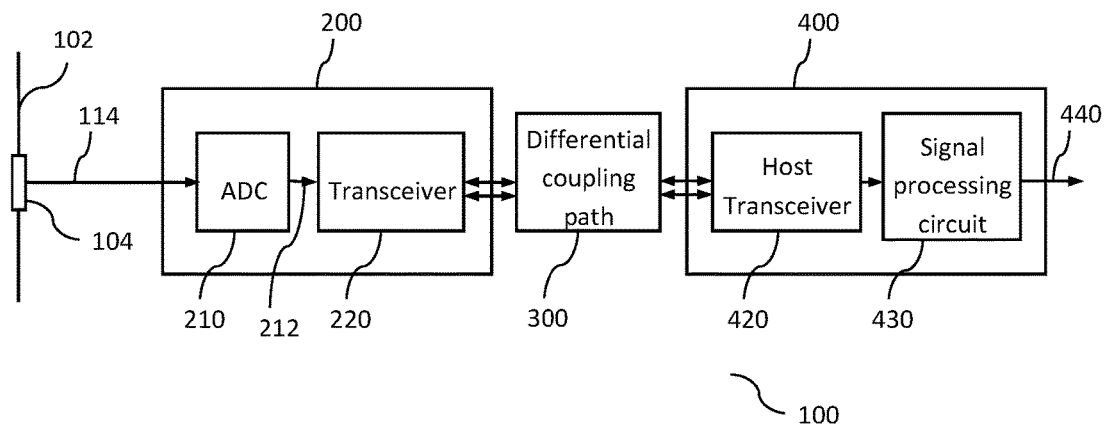
FIG. 1 is a schematic diagram of a power measurement system comprising a line side device in communication with a host device via a differential coupling path in accordance with an embodiment of the present invention.

FIG. 1 shows a schematic diagram of a power measurement system 100 in accordance with an embodiment of the present invention. The system comprising at least one sensor 104, a line side device 200, a host device 400 and a differential coupling path 300 coupled between the line side device 200 and the host device 400. The sensor 104 is a single sensor or a sensor pair. In one embodiment, the sensor 104 may comprise a current sensor, such as a current shunt, a Rogowski coil, a current transformer, or the like, to sense the current running through a power line 102. In another embodiment, the sensor 104 may also comprise a voltage sensor, such as a voltage divider, or the like, coupled between the power line and a neutral line (or ground, not shown in FIG. 1) to measure the voltage of the power line 102. The sensor 104 sends a sensor output signal 114 (the measured voltage signal and/or current signal) to a line-side device 200. The line-side device 200 is in communication with a host device 400 via a bi-directional differential coupling path 300. Although referred to as a line side device and host device, the names are a designation only and are not meant to limit the location of the device. In addition, various sections of the system can be incorporated into the same or separate housings, boards and/or chips.

The line-side device 200 includes at least one analog-to-digital converter 210 and a transceiver 220. The analog-to-digital converter 210, receives sensor output signal 114 (the measured voltage and current signals) directly or indirectly, and converts the signal to a digital signal 212. The digital signal 212 is then sent to the transceiver 220 which transmits the digital signal 212 via the differential coupling path 300 to a host transceiver 420 within the host-side device 400.

The host device 400 includes a host transceiver 420 and a signal processing circuit 430. The host transceiver 420 transmits requests to the line side device 200 and receives data from the line side device 200. The signal processing circuit 430 is in communication with the host transceiver 420 and determines an output 440 indicating of power usage for further use, such as, for example, for display by a display device or for communication to a power supplier.

The differential coupling path 300 is a differential path comprising a pair of coupling links. The transceiver 220 and the host transceiver 420 respond to the voltage difference between the coupling links. The adaption of differential coupling path is effective in eliminating common mode signal interference. Although the differential coupling path as shown in the example of FIG. 1 is a bi-directional path, it is understood that various other embodiments may be implemented for the coupling path. For example, the differential coupling path may be a unidirectional differential link such that the line side device always transmits signal and the host device always receives signal. In the case of unidirectional differential link, the transceiver 220 actually functions as (or may be replaced by) a transmitter and the host transceiver 420 actually functions as (or may be replaced by) a receiver.

In one embodiment, differential coupling path 300 is a differential path with capacitor components only on each coupling link. In another embodiment, differential coupling path 300 is a differential path with both resistor and capacitor components on each coupling link. Preferably, resistor and capacitor values of the two coupling links are identical for optimum common mode signal attenuation. Practically, resistor and capacitor values of the two coupling links are mismatched slightly due to the existence of engineering tolerance. The mismatch percentage for the resistor value may or may not be the same as the mismatch percentage for the capacitor value. The small mismatch does not significantly affect the common mode signal attenuation cross the coupling path.

Figure 2:
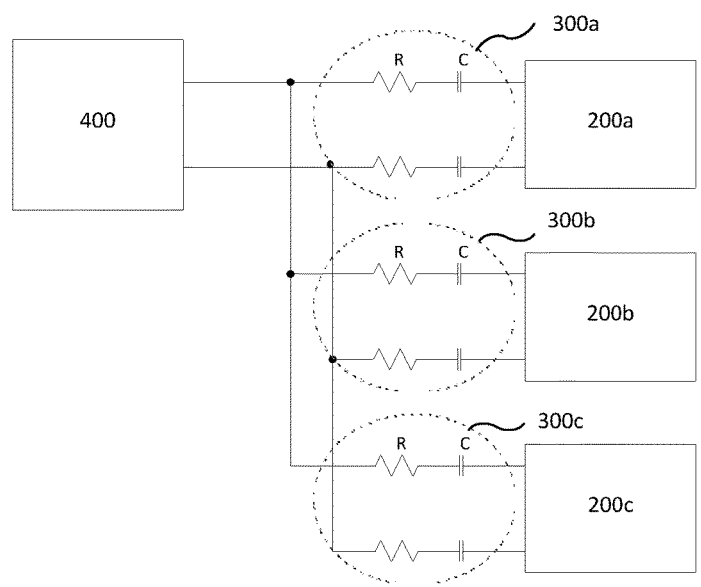
FIG. 2 is an exemplary schematic diagram of a host side device in communication with one or more host devices via multiple differential coupling paths according to various embodiments of the invention.

FIG. 2 shows an exemplary schematic diagram of a host side device in communication with one or more host devices via multiple differential coupling paths according to various embodiments of the invention. The host device 400 is in communication with line side devices 200*a*, 200*b* and 200*c* via differential coupling paths 300*a*, 300*b* and 300*c* respectively. Each path is a differential path having a pair of resistor-capacitor (RC) coupling link. The resistor and capacitor values of the two RC coupling links are identical for optimum common mode signal attenuation. Each line side device (200*a*, 200*b* or 200*c*) communicates to the host device 400 at different time intervals such that there is no interference between those line side devices. The coordination of the communication interval for each line side device may be implemented by the host device 400 in a predetermined or a dynamic way. Although each couple link has only one capacitor in each couple link as shown in FIG. 2, it is understood that the capacitor may be an equivalent capacitor comprising multiple capacitors in series, parallel, and/or mixture connection.

Figure 3:
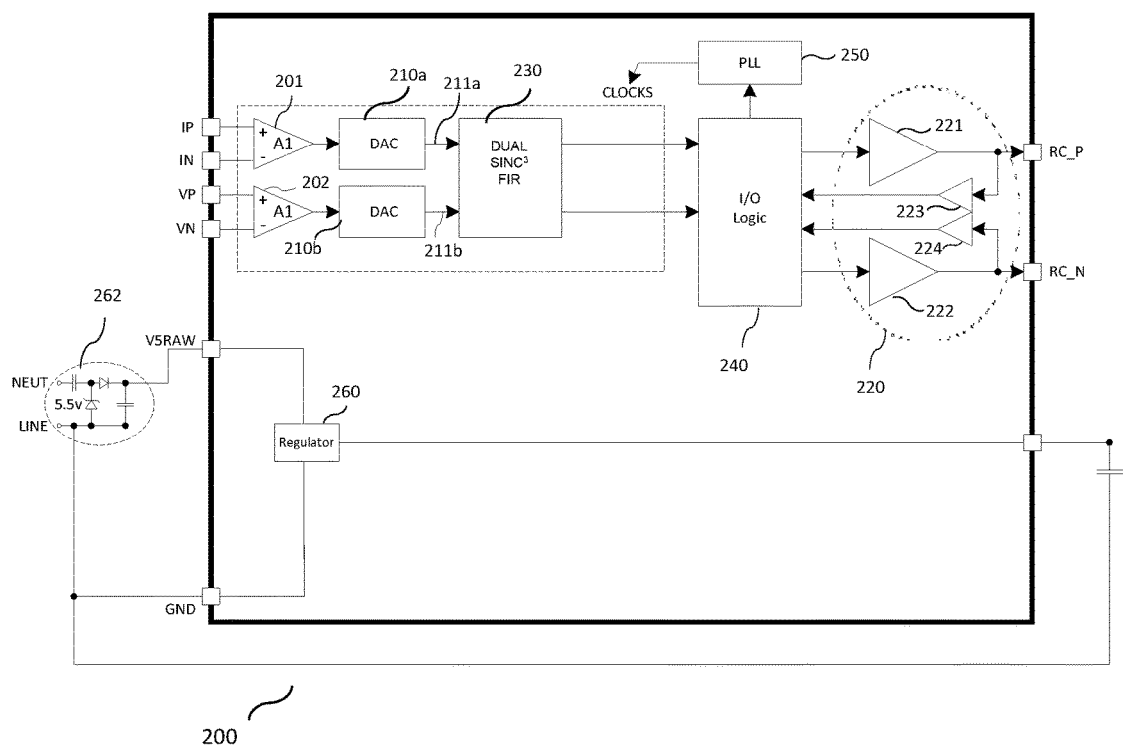
FIG. 3 is an exemplary schematic diagram of a line side device according to various embodiments of the invention.

FIG. 3 is an exemplary schematic diagram of a line side device according to various embodiments of the invention. The line side device 200 comprises a pair of amplifier 201 and 202 to receive measured voltage signal via port VP/VN and measured current signal via port IP/IN respectively. A/D converters 210*a* and 210*b* receive output from the amplifier 201 and 202 and generate a pair of digital signal 211*a* and 211*b*, which are sent to an I/O logic circuit 240 directly or via an optional dual SINC finite impulse response (FIR) filter 230. The I/O logic circuit 240 couples to a transceiver 220 to transfer data to the host device or receive data from the host device. In one embodiment, the line side device 200 comprises a phase lock loop (PLL) 250 coupled to the I/O logic circuit 240 and operates to provide a clock signal to the A/D converters 210*a* and 210*b*, FIR filter 230 and other components needing clock signal input. The I/O logic circuit 240 may comprise a microprocessor (or a microcontroller circuit) and a cache (or internal memory to store data and preloaded operation logics executable by the logic circuit 240).

In some embodiments, the transceiver 220 comprises a pair of transmit amplifier 221 and 222, a pair of receiver amplifier 223 and 224. When the transceiver 220 transfers data to the host device 400, the pair of transmit amplifier 221 and 222 actively couples to the differential coupling path 300. When the transceiver 220 receives data from the host device 400, the pair of receiver amplifier 223 and 224 actively couples to the differential coupling path 300.

In some embodiments, the line side device 200 comprises a voltage regulator 260 to provide power source to the line side device 200. An external voltage stabilizer circuit 262 (such as a Zener diode regulator) couples between a power line and a neutral line to provide a raw voltage source to the voltage regulator 260. The voltage regulator 260 generates a high precision 3.3V voltage output from the raw voltage source to power the line side device 200. Although described with respect to a Zener diode regulator, a person of skill in the art will understand from the disclosure herein that various other voltage regulators can also be used with the present disclosure.

Figure 4:
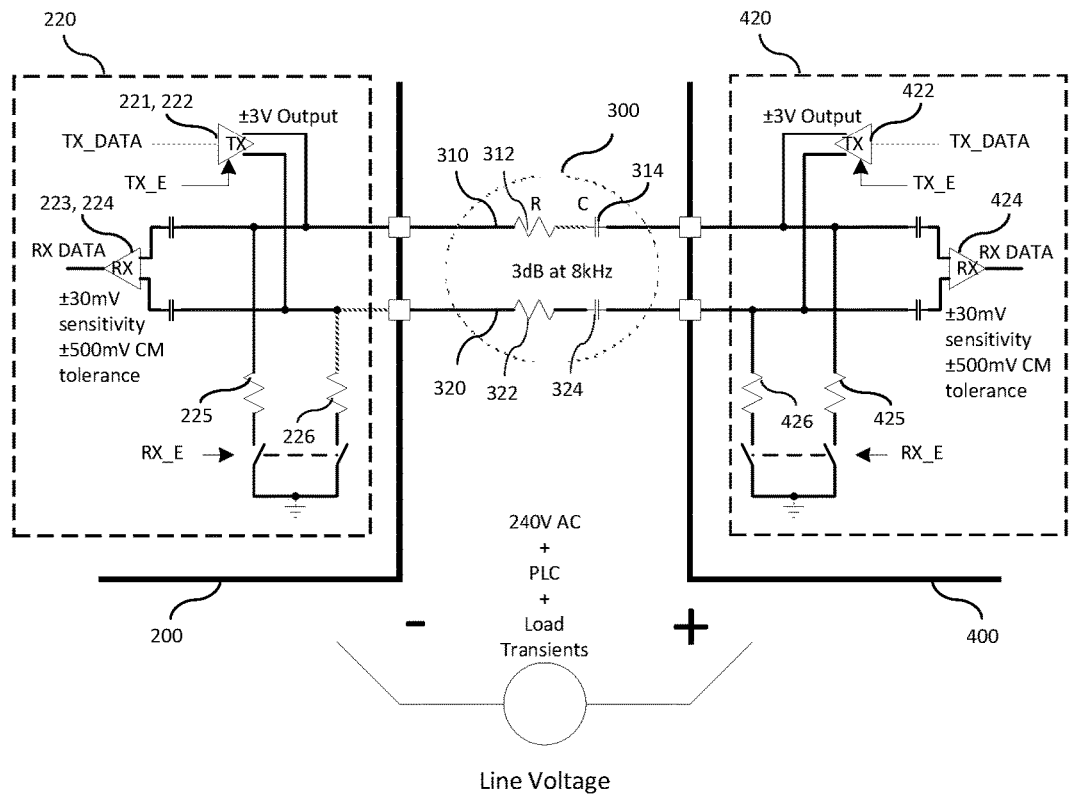
FIG. 4 a) is an exemplary schematic diagram of a transceiver within a line side device in communication with a host transceiver within a host device via a resistor-capacitor (RC) differential path according to various embodiments of the invention.
Figure 4:
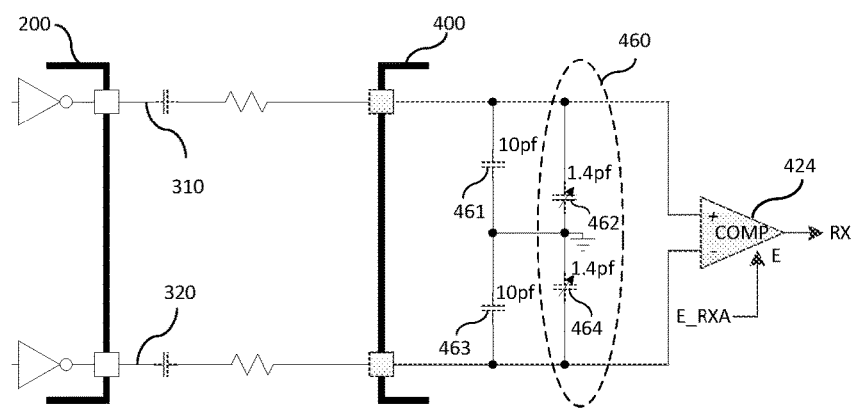

FIG. 4 *a*) is an exemplary schematic diagram of a transceiver 220 within a line side device 200 in communication with a host transceiver 420 within a host device 400 via a differential coupling path 300 according to various embodiments of the invention. Similar to the transceiver 220 within the line side device 200, the host transceiver 420 comprises a host transmitter amplifier 422 and a host receiver amplifier 424 for amplifying of transmitted signal and received signal respectively.

The differential path 300 comprises a first coupling link 310 and a second coupling link 320. The transceiver 220 and the host transceiver 420 respond to the voltage difference between the coupling links. Each coupling link comprises a resistor and a capacitor. Preferably, the resistor 312 and capacitor 314 of the first coupling link 310 are identical to the resistor 322 and capacitor 324 of the second coupling link 320. Practically, the resistor 312 and capacitor 314 of the first coupling link 310 are mismatched slightly from the resistor 322 and capacitor 324 of the second coupling link 320 due to the existence of engineering tolerance. The mismatch percentage for the resistor value may or may not be the same as the mismatch percentage for the capacitor value. For example, the resistors on the coupling links are mismatched by 2% and the capacitors on the coupling links are mismatched by 5%. Even with the small mismatch, the common mode signal attenuation cross the coupling path is still within accepted range. In some embodiments, the parameters of the first coupling link 310 and the second coupling link 320 are measured after the actual differential path is adopted for the determination of the actual mismatch percentage. The host transceiver may compensate the received differential signal with the actual mismatch percentage being taken into consideration.

FIG. 4 *b*) shows an exemplary schematic diagram within a host device with differential path mismatch compensation circuit 460 coupled to the differential path 300 according to various embodiments of the invention. The mismatch compensation circuit 460 comprises a first tunable capacitor pair 462 coupled to the first coupling link 310 and a second tunable capacitor 464 coupled to the second coupling link 320. In some embodiments, the first tunable Capacitor 462 is in parallel connection with existing coupling capacitor 461 and has a capacitance smaller than capacitor 461. Similarly, the second tunable capacitor 464 is in parallel connection with existing coupling capacitor 463 and has a capacitance smaller than the capacitor 463. For example, capacitor 461 and capacitor 463 have a capacitance of 10 pf. Capacitor 462 and capacitor 464 have a capacitance of 1.4 pf. Both capacitor 462 and capacitor 464 have variable capacitance such that the overall capacitance of the two capacitor pairs may be adjusted to balance the inevitable mismatch between the two coupling links. In one embodiment, each capacitor with variable capacitance is an n-bit binary weighted circuit and the binary values are stored in a memory within the host device 400. In operation, a common mode voltage is applied to the host device 400 and the variable capacitor value is programmed such that the differential comparator (host receiver amplifier 424) does not respond to the common mode signal. Although FIG. 4*b*) is described with respect to a capacitor with variable capacitance coupled to each differential link, a person of skill in the art will understand that various other configurations may be implemented. For example, the mismatch compensation circuit 460 may only use tunable resistors or inductors instead of tunable capacitors. The mismatch compensation circuit 460 may also use combination of different types of tunable elements to balance the differential path mismatch.

When the transceiver 220 transfers data to the host device 400, the transmit amplifier (221 and 222) actively couples to the differential coupling path 300. When the transceiver 220 receives data from the host device 400, the receiver amplifier (223 and 224) actively couples to the differential coupling path 300. Similarly, when the host transceiver 420 transfers data to the line side device 200, the host transmit amplifier 422 actively couples to the differential coupling path 300. When the host transceiver 420 receives data from the line side device 200, the host receiver amplifier 424 actively couples to the differential coupling path 300.

In some embodiments, the transceiver 220 comprises a pair of coupling resistor 225 and 226 coupling to the first coupling link 310 and the second coupling link 320 respectively. Similarly, the host transceiver 420 comprises a pair of host coupling resistor 425 and 426 coupling to the first coupling link 310 and the second coupling link 320 respectively. The coupling resistors (225 and 226) and the host coupling resistors (425 and 426) are smaller in resistance value, preferably in several orders, than the resistors in the coupling path. For example, the coupling resistors (225 and 226) and the host coupling resistors (425 and 426) are 2000Ω and the resistors in the coupling path are around 20 kΩ. When the signal transferred over the coupling path with frequency high enough (such as 4 Mb/s), the capacitors on the coupling links can be basically considered as an AC short. The differential signal will be attenuated by the ratio of the coupling resistor on the receiving device (either the line side device or the host device) to the resistors in the coupling path. With the aforementioned resistor parameters, the differential signal will be attenuated by 100 times (200 kΩ/2000Ω. Common mode signal will also be attenuated by this ratio. If there is 50V of common mode on the line, it will be attenuated down to 0.5V. The differential signal will also be attenuated and will be 3 v/100=30 mV. This defines the sensitivity requirement for the comparator.

In some embodiment, the coupling resistors (225 and 226) and the host coupling resistors (425 and 426) only couple the differential coupling path 300 when the line side device 200 or the host device 400 operates to receive signals. The control of the coupling interval may be implemented via a controllable switch disposed between the coupling resistors (or the host coupling resistors) and ground. In some embodiment, an internal high pass filter is integrated within the receiver amplifier and the host receiver amplifier to further attenuate low-frequency component of the signal transferred from the differential coupling path.

Figure 5:
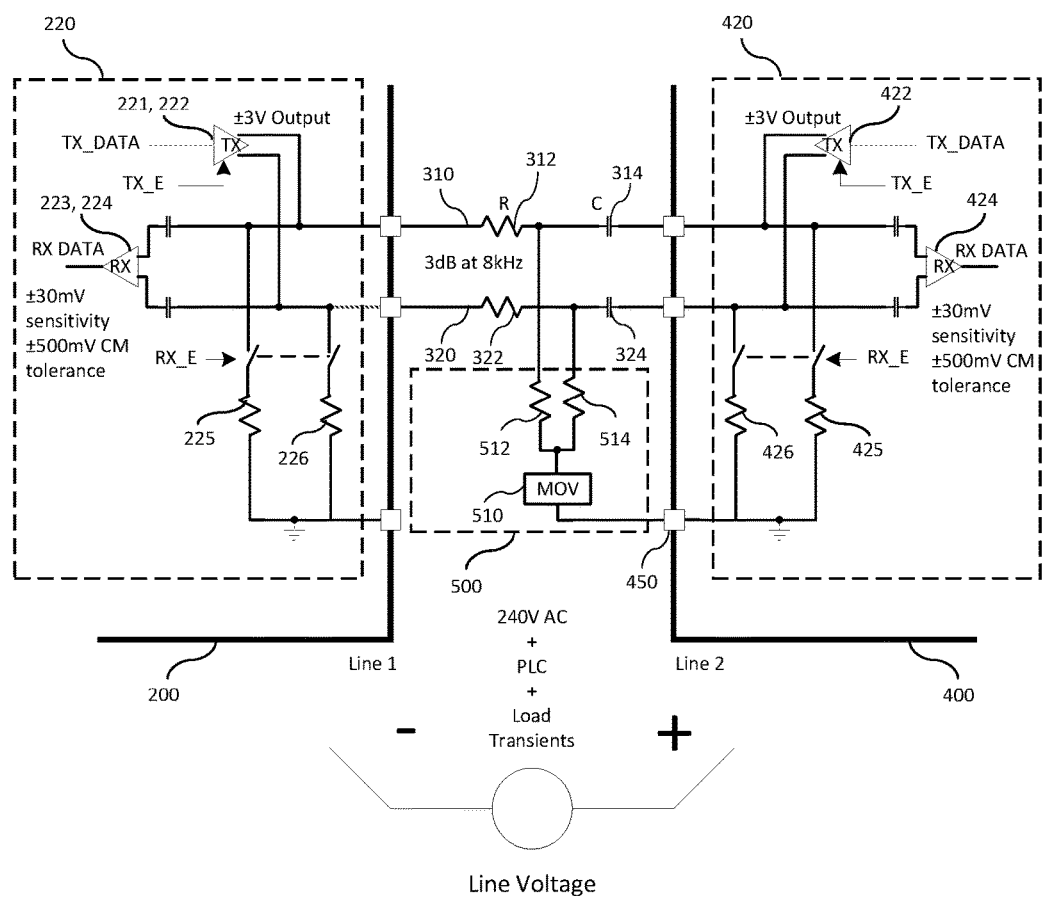
FIG. 5 is another exemplary schematic diagram of a transceiver within a line side device in communication with a host transceiver within a host device via a resistor-capacitor (RC) differential path according to various embodiments of the invention.

FIG. 5 is another exemplary schematic diagram of a transceiver 220 within a line side device 200 in communication with a host transceiver 420 within a host device 400 via a differential coupling path 300 according to various embodiments of the invention. Compared to the schematic diagram shown in FIG. 4, the schematic diagram in FIG. 5 further incorporates a clamp circuit 500, which comprises a Metal oxide varistor (MOV) 510 coupled to both coupling links 310 and 320 via resistor 512 and resistor 514 respectively. In one embodiment, the resistor 512 and resistor 514 have the same resistance of 20 kΩ, which is rated 1/10 of the resistance of the resistor 312 (or 322). The MOV 510 also connects to a ground port 450 of the host device 400.

The MOV 510 and the resistors 512, 514 provide extra surge protection to the host device 400, especially when there is no surge protection on the line side device 200. The surge from lightning strike may be 70 us wide and 7 kV high. A MOV provides effective surge protection to the host device 400 and is more economic compared to a 7 KV rated capacitor.

Typically, a MOV has an equivalent of 100 kΩ internal series resistance for lowest possible Joules rating. The 20 kΩ resistors (resistors 512, 514) prevent the MOV's approximately 100 pf capacitance from attenuating the high frequency data stream. The resistors will cause approximately 10% loss in signal to the ground port 450. The final power rating of the 20 k resistors (resistors 512, 514) depends on the surge specification, the MOV clamp voltage, and the capacitor rating. This circuit is tolerant of MOV leakage up until it becomes an unacceptable leakage across the voltage barrier. MOV leakage current contains a Mains frequency component and needs to be carefully handled on the line side device 200.

Figure 6:
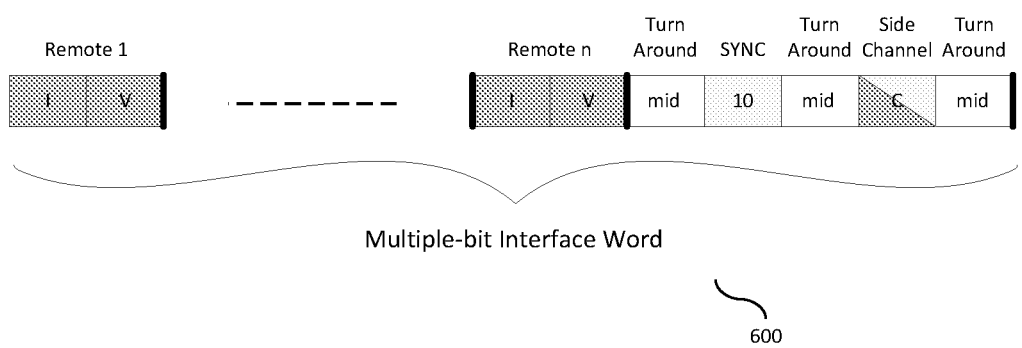
FIG. 6 is an exemplary data structure of an interface word for the communication between a host device and a line side device according to various embodiments of the invention.

FIG. 6 is an exemplary data structure of an interface word for the communication between a host device and a line side device according to various embodiments of the invention. In one embodiment, the communication between the host device and line side device is implemented via Manchester code. Manchester coding is a line code in which the encoding of each data bit has at least one transition and occupies the same time. Manchester coding has no DC component, and therefore may be inductively or capacitively coupled. One skilled in the art will recognize that various other modulation and coding implementations may be also practiced for the communication between the host device 400 and the line side device 200.

In one embodiment, the Manchester bit rate is 10 MHz. Each bit consists of a two state sequence: 0-01, and 1-10. Since the Manchester data is sent differentially, it is possible to send a third value, a 'mid' scale signal, by driving both TX pins to 0. This is what the TX sends during turn around.

A low frequency side channel is also defined through which the host device 400 sends configuration commands to the line side device 200 and the line side device 200 sends temperature and other state information to the host device 400.

Referring to FIG. 6, the basic communication channel consists of continuously transmitted words with multiple bits. Each word contains the ADC modulator results from the N remotes (line side devices 200). It also contains a SYNC pattern and the bidirectional side channel.

During the operation, the communication between the line side device 200 and the host device 400 is susceptible to various impairments. The communication is required to be robust enough to withstand those impairments. The table 1 below lists several major impairments for the communication between the line side device 200 and the host device 400, as well as the robustness of the system.

TABLE 1

Communication Impairments and System Robustness

| Impairment | Description | Required Device Behavior | System Robustness |
|---|---|---|---|
| EFT | Bursts of 8 kV 50 ns pulses | Must continue metering, but with some increased error allocation | Communication channel will miss a few samples, less than 1%, and will tolerate the resulting error. |
| Magnetic | Large external field can saturate pulse transformers | Must continue metering with no increase of error. | Communication channel is insensitive to magnetic field. |
| Surge | 70 us wide 85 V pulse | Must survive | A clamp of some sort may be required. If an MOV is not placed at the meter inputs, a small MOV may be used to protect the communication capacitor. |

With the differential coupling link between the line side device 200 and the host device 400, especially with the incorporation of the claim circuit 500, the power measurement system 100 is robust enough for most impairments.

The foregoing description of the invention has been described for purposes of clarity and understanding. It is not intended to limit the invention to the precise form disclosed.

Various modifications may be possible within the scope and equivalence of the application.

The invention claimed is:

1. A method for electrical power measurement, the method comprising:
coupling M line side devices to a power grid to extract measurement signals, the measurement signals comprising voltage signals and current signals;
converting the measurement signals to digital signals; and
sending the digital signals to N host devices via N differential coupling paths coupled between the N host devices and the M line side devices, wherein both M and N are positive integers, and wherein each host device comprises a mismatch compensation circuit comprising adjustable capacitors to compensate a parameter mismatch within the corresponding differential coupling path.

2. The method of claim 1, wherein each differential coupling path is a differential resistor-capacitor (RC) coupling path comprising two coupling links, wherein each coupling link comprises a resistor and a capacitor in serial connection.

3. The method of claim 2, wherein values of the resistor and capacitor of the two coupling links are identical for optimum common mode signal attenuation.

4. The method of claim 1, wherein each differential coupling path is a differential capacitor coupling path, wherein the coupling path comprises two capacitive coupling links.

5. The method of claim 1, wherein the adjustable capacitors are arranged in a binary weighted circuit having binary values that are stored in memory within the host device.

6. The method of claim 1, wherein each line side device comprises at least two A/D converters, an I/O logic module receiving outputs from the A/D converters, and a transceiver coupled to the A/D converters, the transceiver transferring data to the corresponding host device.

7. The method of claim 6, wherein the transceiver comprises a coupling resistor pair coupled to the corresponding differential coupling path only when the transceiver is in a receiver mode to receive signals from the corresponding host device.

8. The method of claim 1, wherein each host device comprises a host coupling resistor pair coupled to the corresponding differential coupling path only when the host device is in a receiver mode to receive signals from the corresponding line side device.

9. The method of claim 1, wherein each line side device communicates to the corresponding host devices at one of a plurality of different time intervals.

10. The method of claim 9, wherein the plurality of different time intervals are determined by the line side device in one of a predetermined and a dynamic mode.

11. The method of claim 1, wherein each differential coupling path is bi directional.

12. The method of claim 1, wherein each differential coupling path is unidirectional such that a corresponding line side device transmits signals to a corresponding host device that receives the signals.

13. An apparatus for power measurement, the apparatus comprising:
M line side devices coupled to a power grid to extract measurement signals, the M line side devices converting the measurement signals to digital signals;
N host devices in communication with the M line side devices; and
N differential coupling paths coupled between the N host devices and the M line side devices, each of the N differential coupling paths comprising two coupling links, wherein both M and N are positive integers, and wherein each host device comprises a mismatch compensation circuit comprising adjustable capacitors to compensate a parameter mismatch within the corresponding differential coupling path.

14. The apparatus of claim 13, wherein the measurement signals comprise voltage signals measured with a voltage sensor and current signals measured with a current sensor.

15. The apparatus of claim 14, further comprising a clamp circuit coupled to each of the N differential coupling paths to provide surge protection to each of the N host devices.

16. The apparatus of claim 15, wherein the clamp circuit comprises a metal oxide varistor (MOV) coupled to each coupling link through a pair of resistors.

17. The apparatus of claim 13, wherein each coupling link comprises a resistor and a capacitor in serial connection matched to eliminate common interference.

18. The apparatus of claim 17, wherein each line side device comprises at least two A/D converters, an I/O logic module receiving inputs from the A/D converters, and a transceiver coupled to the A/D converters, the transceiver transferring data to the corresponding host device.

19. The apparatus of claim 18, wherein the transceiver comprises a pair of coupling resistors coupled to one of the N differential coupling paths only when the transceiver is in a receiver mode to receive signals from the corresponding host device.

20. The apparatus of claim 19, wherein the coupling resistors are smaller in resistance value than the resistor of the coupling links.

21. The apparatus of claim 18, wherein the transceiver of each line side device comprises a pair of transmit amplifiers and a pair of receiver amplifiers, when the transceiver transfers data to the corresponding host device, the pair of transmit amplifiers actively couples to one of the N differential coupling paths, when the transceiver receives data from the corresponding host device, the pair of receiver amplifiers actively couples to the corresponding differential coupling path.

22. The apparatus of claim 18, wherein each line side device further comprises at least two amplifiers to respectively receive the voltage signals and the current signals.

23. The apparatus of claim 18, wherein each line side device further comprises a phase lock loop coupled to the I/O logic module to provide a clock signal to the A/D converters.

24. The apparatus of claim 18, wherein each line side device further comprises a dual SINC finite impulse response filter coupled between the A/D converters and the I/O logic module.

25. The apparatus of claim 17, wherein each host device comprises a pair of host coupling resistors coupled to the N differential coupling paths only when the host device is in a receiver mode to receive signals from the corresponding line side device.

26. The apparatus of claim 25, wherein the host coupling resistors are smaller in resistance value than the resistor of the coupling links.

27. The apparatus of claim 17, wherein the adjustable capacitors are arranged in a binary weighted circuit having binary values that are stored in memory within the host device.

28. The apparatus of claim 17, wherein each line side device further comprises a voltage regulator to provide a voltage source therein.

29. The apparatus of claim 13, wherein each host side device comprises a host transmitter amplifier and a host receiver amplifier for respectively amplifying transmitted signals from the host side device and received signals from the corresponding line side device.

* * * * *